United States Patent
Xiang et al.

(10) Patent No.: US 10,631,402 B2
(45) Date of Patent: Apr. 21, 2020

(54) FLEXIBLE DISPLAY DEVICE AND MOBILE TERMINAL

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Desheng Xiang, Beijing (CN); Yanming Wang, Beijing (CN); Jiaqiang Wang, Beijing (CN); Rui Liu, Beijing (CN); Cheng Chang, Beijing (CN); Jian Ren, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/321,888

(22) PCT Filed: Apr. 13, 2018

(86) PCT No.: PCT/CN2018/083061
§ 371 (c)(1),
(2) Date: Jan. 30, 2019

(87) PCT Pub. No.: WO2018/192426
PCT Pub. Date: Oct. 25, 2018

(65) Prior Publication Data
US 2019/0182947 A1    Jun. 13, 2019

(30) Foreign Application Priority Data
Apr. 17, 2017  (CN) .......................... 2017 1 0249540

(51) Int. Cl.
*G09F 9/30* (2006.01)
*G06F 1/16* (2006.01)
(Continued)

(52) U.S. Cl.
CPC ....... *H05K 1/028* (2013.01); *G02F 1/133305* (2013.01); *G09F 9/301* (2013.01);
(Continued)

(58) Field of Classification Search
CPC ........ G09F 9/301; G09F 9/302; G09F 9/3023; G06F 1/1652; G06F 1/1637; G06F 1/1618; G06F 1/1622; G03B 21/56
See application file for complete search history.

(56) References Cited

U.S. PATENT DOCUMENTS 9,448,660 B2     9/2016 Seo et al.
2005/0040962 A1* 2/2005 Funkhouser .......... G06F 1/1601
                                                  340/815.4
(Continued)

FOREIGN PATENT DOCUMENTS

CN   201509217 U   6/2010
CN   102026821 A   4/2011
(Continued)

OTHER PUBLICATIONS

PCT International Search Report, Application No. PCT/CN2018/083061, dated Jul. 17, 2018, 5 pages: with English translation.
(Continued)

*Primary Examiner* — Hoa C Nguyen
(74) *Attorney, Agent, or Firm* — Armstrong Teasdale LLP

(57) ABSTRACT

A flexible display device and a mobile terminal including the same are provided, whose portability is improved, and which enable diverse choices of the screen sizes. The flexible display device includes a receptacle mechanism and a flexible display screen, wherein the receptacle mechanism
(Continued)

includes a first end cap and a second end cap opposed to each other, a spool pivotally mounted on the first end cap and the second end cap, a ratchet fixedly connected to the spool, a pawl hinged to the first end cap, a pretension spring abutting the first end cap and the pawl respectively, and a reset spring fixedly connected to the spool and the second end cap respectively. The flexible display screen includes a first lateral edge and a second lateral edge opposed to each other, and the first lateral edge is fixedly connected to the spool.

12 Claims, 8 Drawing Sheets

(51) Int. Cl.
 *H05K 1/02* (2006.01)
 *H05K 1/03* (2006.01)
 *H01L 51/00* (2006.01)
 *G02F 1/1333* (2006.01)
 *H04M 1/02* (2006.01)

(52) U.S. Cl.
 CPC ...... *H01L 51/0097* (2013.01); *H04M 1/0268* (2013.01); *H05K 1/0393* (2013.01); *H01L 2251/5338* (2013.01)

(56) References Cited

U.S. PATENT DOCUMENTS

| | | | |
|---|---|---|---|
| 2013/0265262 A1 | 10/2013 | Jung et al. | |
| 2013/0314762 A1* | 11/2013 | Kwack | G02F 1/09 359/280 |
| 2014/0262512 A1* | 9/2014 | Kingsley | E21B 19/08 175/40 |
| 2015/0338888 A1 | 11/2015 | Kim et al. | |
| 2015/0340004 A1* | 11/2015 | Pang | G09G 5/00 345/205 |
| 2016/0139633 A1* | 5/2016 | Lee | G06F 1/1652 345/33 |
| 2016/0205791 A1* | 7/2016 | Kim | G06F 1/1652 361/679.01 |
| 2017/0023978 A1* | 1/2017 | Cho | G06F 1/1652 |
| 2017/0309226 A1* | 10/2017 | In | G09G 3/20 |
| 2017/0318689 A1* | 11/2017 | Kim | G03B 21/58 |
| 2017/0367198 A1* | 12/2017 | Park | H01L 51/5237 |
| 2018/0376603 A1* | 12/2018 | Lee | G06F 1/1652 |

FOREIGN PATENT DOCUMENTS

| | | |
|---|---|---|
| CN | 203732852 U | 7/2014 |
| CN | 204190799 U | 3/2015 |
| CN | 104732890 A | 6/2015 |
| CN | 104937654 A | 9/2015 |
| CN | 105609001 A | 5/2016 |
| CN | 105702164 A | 6/2016 |
| CN | 105810104 A | 7/2016 |
| CN | 105979037 A | 9/2016 |
| CN | 205750635 U | 11/2016 |
| CN | 106233361 A | 12/2016 |
| CN | 106371506 A | 2/2017 |
| CN | 106448465 A | 2/2017 |
| CN | 107067981 A | 8/2017 |

OTHER PUBLICATIONS

PCT Written Opinion, Application No. PCT/CN2018/083061, dated Jul. 17, 2018, 6 pages.: with English translation of relevant part.
China First Office Action, Application No. 201710249540.7, dated Dec. 21, 2018, 25 pps.: with English translation.

* cited by examiner

FLEXIBLE DISPLAY DEVICE AND MOBILE TERMINAL

CROSS REFERENCE TO RELATED APPLICATIONS

This patent application is a National Stage Entry of PCT/CN2018/083061 filed on Apr. 13, 2018, which claims the benefit and priority of Chinese Patent Application No. 201710249540.7 filed on Apr. 17, 2017, the disclosures of which are incorporated by reference herein in their entirety as part of the present application.

BACKGROUND

The present disclosure relates to the field of flexible display technologies, and in particular to a flexible display device and a mobile terminal.

For mobile terminals such as mobile phones, smart watches, and smart bracelets, an increased display screen size may enhance the display effect and creates a better visual experience for its user. However, the mobile terminal may suffer from an increase in the space occupied thereby caused by the increased display screen size, which leads to not only inconvenience in carrying or wearing, but also affecting the aesthetics of the product.

In addition, the display screens of currently available mobile terminals usually have a fixed size. Therefore, while displaying some content, the display screens cannot show more details due to the limited size. If the display screen is a touch screen, operation accuracy by the user may be affected.

BRIEF DESCRIPTION

Embodiments of the present disclosure provide a flexible display device and a mobile terminal to improve portability of the flexible display device and the mobile terminal including the same, and realize diverse choices of the screen size of the flexible display device.

The embodiments of the present disclosure provide a flexible display device including a receptacle mechanism and a flexible display screen, wherein the receptacle mechanism includes a first end cap and a second end cap opposed to each other, a spool pivotally mounted on the first end cap and the second end cap, a ratchet fixedly connected to the spool, a pawl hinged to the first end cap, a pretension spring abutting the first end cap and the pawl respectively, and a reset spring fixedly connected to the spool and the second end cap respectively, the flexible display screen includes a first lateral edge and a second lateral edge opposed to each other, the first lateral edge being fixedly connected to the spool, when a first external force in a direction away from the spool is applied to the second lateral edge of the flexible display screen, the spool and the ratchet are rotated in a positive direction, and the reset spring accumulates energy, such that the flexible display screen is stretched-out, when the first external force is cancelled, the pawl is inserted between teeth of the ratchet under a pretension force of the pretension spring to block a reverse rotation of the spool and the ratchet, and thus to lock a stretched-out size of the flexible display screen, when a second external force against the pretension force of the pretension spring is applied to the pawl, the pawl is separated from the ratchet, the spool and the ratchet are rotated reversely by a resetting force of the reset spring, and the flexible display screen is reeled on the spool.

By virtue of the technical solution of the embodiments of the present disclosure, the flexible display screen can be reeled on the spool when not in use, so that the flexible display device and the mobile terminal including the same are small in size and convenient to carry, the flexible display screen can be stretched-out to a desired size by pulling the second lateral edge thereof to cause the spool and the ratchet to rotate in the positive direction. When the desired stretched-out size of the flexible display screen is reached, pulling of the second lateral edge is stopped to block the reverse rotation of the spool and the ratchet and to lock the stretched-out size of the flexible display screen, when it is desired to reel the flexible display screen, the pawl is shifted to separate it from the ratchet so that the flexible display screen is re-reeled on the spool. The solution improves the portability of the flexible display device and the mobile terminal including the flexible display device, realizing diverse choices of the screen size of the flexible display device.

The receptacle mechanism further includes a housing spaced from and sheathed onto the spool. The housing may have a flexible display screen outlet, and the second lateral edge of the flexible display screen is provided with a stopper that can be cooperative with the flexible display screen outlet. The first end cap may have a chute through-hole, and the pawl may have a post that passes through the chute through-hole and extends to the outside of the first end cap. The spool may be a hollow spool with a through slot such that at least one functional module and/or at least one circuit board can be placed inside the hollow spool. The housing can protect the flexible display screen that is reeled therein to effectively prevent accidental damage or scratch, the pre-tighten force of the pre-tightened spring can be overcome by shifting the post to move in the chute through-hole, so as to separate the pawl from the ratchet, the inner space of the hollow spool can be used to accommodate components such as a circuit board, thereby effectively utilizing the space, and making the flexible display device and the mobile terminal including the same more compact and portable.

The flexible display screen may include a flexible display screen body and an elastic support structure on a back side of the flexible display body. The elastic support structure may include an elastic support layer that bulges towards the flexible display screen body and extends in the stretching direction of the flexible display screen. When the stretched-out portion of the flexible display screen is displaying, the elastic support structure may function for supporting and keeping the stretched-out portion flat, thereby achieving a better display effect.

The elastic support structure may include the elastic support layer only.

The elastic support structure may further include a first buffer flat layer on a side of the elastic support layer adjacent to the flexible display screen body, and a second buffer flat layer on a side of the elastic support layer away from the flexible display screen body. With this design, when the stretched-out portion of the flexible display screen is displaying, the front and rear surfaces thereof are flat for better display effect, and the first buffer flat layer and the second buffer flat layer can buffer and protect the flexible display screen body.

The flexible display screen may further include a buffer layer and a circuit layer. The buffer layer, the circuit layer and the elastic support structure are sequentially disposed on the back side of the flexible display screen body. With this design, some circuits of the flexible display device or the mobile terminal can be designed in the circuit layer of the flexible display screen and reeled with the flexible display screen, thereby allowing the flexible display device or the mobile terminal to have a smaller volume.

The flexible display device may further include detecting means for detecting rotation information of the spool or the ratchet, and a controller electrically connected to the detecting means and to the flexible display screen, wherein the controller is configured to determine stretched-out size information of the flexible display screen according to the rotation information of the spool or the ratchet, control the stretched-out portion of the flexible display screen to display according to the stretched-out size information of the flexible display screen, and control the reeled portion of the flexible display screen to be in an inactive state. With this design, only the stretched-out portion of the flexible display screen is in an active state, while the reeled portion is in the sleep state, thereby effectively reducing power consumption of the flexible display device.

The embodiments of the present disclosure further provide a mobile terminal, including a mobile terminal body, and the flexible display device according to any one of the preceding technical solutions, which is connected to the mobile terminal body. The mobile terminal is easy to carry after the screen is reeled, and in addition presents more diversified screen sizes.

When the receptacle mechanism further includes the housing sheathed onto and spaced from the spool and the housing has a flexible display screen outlet, the first end cap and the second end cap are fixedly connected to the housing, and the first end cap and the second end cap are pivotally connected to the mobile terminal body by a first damping connector and a second damping connector respectively, or the first end cap and the second end cap are fixedly connected to the mobile terminal body, and the first end cap and the second end cap are pivotally connected to the housing by a third damping connector and a fourth damping connector respectively. With any of the above designs, the stretched-out portion of the flexible display screen can be maintained at any angle with respect to the mobile terminal body, to facilitate adjustment by a user and enhance visual effect.

When the spool of the flexible display device is a hollow spool with a through slot, at least one functional module and/or at least one circuit board of the mobile terminal is located inside the hollow spool, thereby making effective use of the space, enabling the mobile terminal more compact and portable.

The mobile terminal body may include a first portion into which the receptacle mechanism is integrated and a second portion to which the second lateral edge of the flexible display screen is connected.

DETAILED DESCRIPTION

Figure 1:
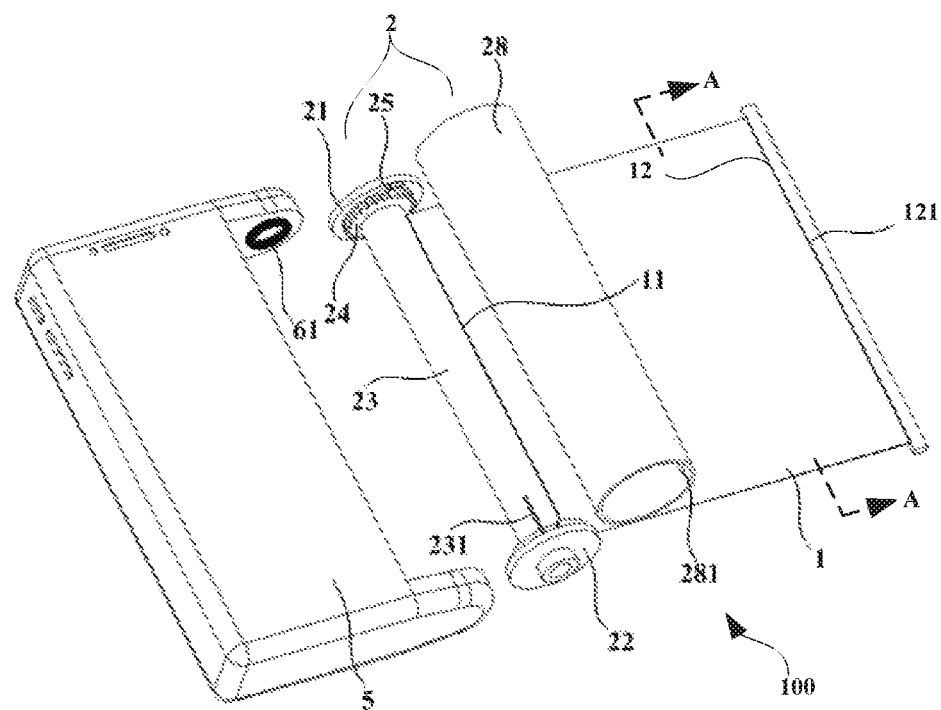
FIG. 1 shows a mobile terminal in an embodiment of the present disclosure.

In order to improve the portability of the flexible display device and the mobile terminal including the same, and to achieve diverse choices of the screen size of the flexible display device, the embodiments of the present disclosure provide a flexible display device and a mobile terminal. The present disclosure will be illustrated in detail with reference to the embodiments so as to make the technical solutions and the advantages of the present disclosure more apparent.

As shown in FIGS. 1 to 5 and 9A, an embodiment of the present disclosure provides a flexible display device 100 including a receptacle mechanism 2 and a flexible display screen 1, wherein the receptacle mechanism 2 includes a first end cap 21 and a second end cap 22 opposed to each other, a spool 23 pivotally mounted on the first end cap 21 and the second end cap 22, a ratchet 24 fixedly connected to the spool 23, a pawl 25 hinged to the first end cap 21, and a pretension spring 26 abutting the first end cap 21 and the pawl 25 respectively, and a reset spring 27 fixedly connected to the spool 23 and the second end cap 22 respectively. The flexible display screen 1 includes a first lateral edge 11 and a second lateral edge 12 opposed to each other, the first lateral edge 11 being fixedly connected to the spool 23. When a first external force in a direction away from the spool 23 is applied to the second lateral edge 12 of the flexible display screen 1, the spool 23 and the ratchet 24 are rotated in a positive direction, the reset spring 27 accumulates energy, and the flexible display screen 1 is stretched-out. When the first external force is cancelled, the pawl 25 is inserted between the teeth of the ratchet 24 under a pretension force of the pretension spring 26 to block a reverse rotation of the spool 23 and the ratchet 24, and thus to lock a stretched-out size of the flexible display screen 1. When a second external force against the pretension force of the pretension spring 26 is applied to the pawl 25, the pawl 25 is separated from the ratchet 24, and then the spool 23 and the ratchet 24 are rotated reversely by a resetting force of the reset spring 27, and the flexible display screen 1 is reeled on the spool 23.

Figure 9A:
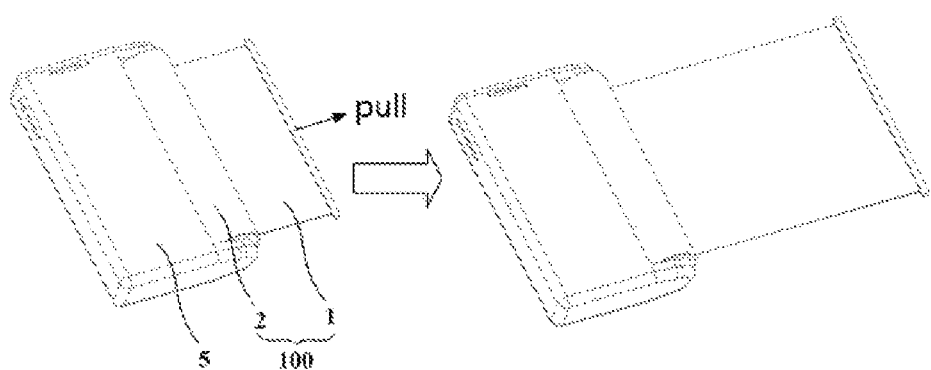
FIG. 9A is a view of an unreeled mobile terminal in an embodiment of the present disclosure.

The flexible display device may be embodied as an independent device for display, for example, a flexible display. In addition, as shown in FIG. 9A, the flexible display device 100 may also serve as a display module assembly or a touch display module assembly of a mobile terminal such as a smart phone, a smart watch, and a smart bracelet. There is no limitation to the specific type of the flexible display screen 1, which may be, for example, a flexible organic light emitting diode display screen, a flexible liquid crystal display screen or a flexible electronic paper display screen and the like, and it may be a touch screen or a non-touch screen.

In the embodiment of the present disclosure, the positive rotation may be a clockwise rotation, while the reverse rotation is a counterclockwise rotation, and the positive rotation may also be a counterclockwise rotation, while the reverse rotation is a clockwise rotation. It can be understood that when the definition of the positive direction (or the reverse direction) is varied, the reeling direction of the flexible display screen 1 on the spool 23 is also different.

In the embodiment of the present disclosure, the ratchet 24, the pawl 25, the pretension spring 26, and the like form a ratchet mechanism. When the flexible display screen 1 is not in use, the pawl 25 is inserted between the teeth of the ratchet 24 under the pretension force of the pretension spring 26 and in contact with the ratchet 24, and the flexible display screen 1 is reeled on the spool 23. The flexible display device and the mobile terminal including the same are small in size and easy to carry.

When the flexible display screen 1 needs to be used, a first external force in a direction away from the spool 23 is applied to the second lateral edge 12 of the flexible display screen 1, namely, the second lateral edge 12 of the flexible display screen 1 is pulled, with the spool 23 and the ratchet 24 being rotated in the positive direction, so that the pawl 25 overcomes the pretension force of the pretension spring 26 to slide over the back of the teeth of the ratchet 24, the reset spring 27 accumulates energy, and the flexible display screen 1 can be stretched-out to a desired size.

When the stretched-out size of the flexible display screen 1 meets the need, the first external force is cancelled. In other words, pulling of the second lateral edge is stopped, and now the pawl 25 is inserted between the teeth of the ratchet 25 and in contact with the ratchet 24 under the pretension force of the pretension spring 26, the reverse rotation of the spool 23 and the ratchet 24 is blocked to lock the stretched-out size of the flexible display screen 1.

When it is desired to retract the flexible display screen 1, a second external force that overcomes the pretension force of the pretension spring 26 is applied to the pawl 25, and thereby the pawl 25 is separated from the ratchet 24, and the spool 23 and the ratchet 24 are rotated reversely by the resetting force of the reset spring 27 to reel the flexible display screen 1 on the spool 23.

If it is required to increase the size of the stretched-out portion when the flexible display screen 1 is partially stretched-out, the second lateral edge 12 of the flexible display screen 1 is pulled continuously until the size of the stretched-out portion meets the need, and if it is required to reduce the size of the stretched-out portion, the pawl 25 is shifted to be separated from the ratchet 24 until the size of the stretched-out portion meets the need.

It can be seen from the flexible display device provided by the embodiment of the present disclosure that the flexible display screen 1 is reeled on the spool 23 when not in use, and may have optional and flexible stretched-out size when in use. Therefore, the portability of the flexible display device and the mobile terminal including the same is improved and diverse choices of the screen size of the flexible display screen are realized.

Figure 3:
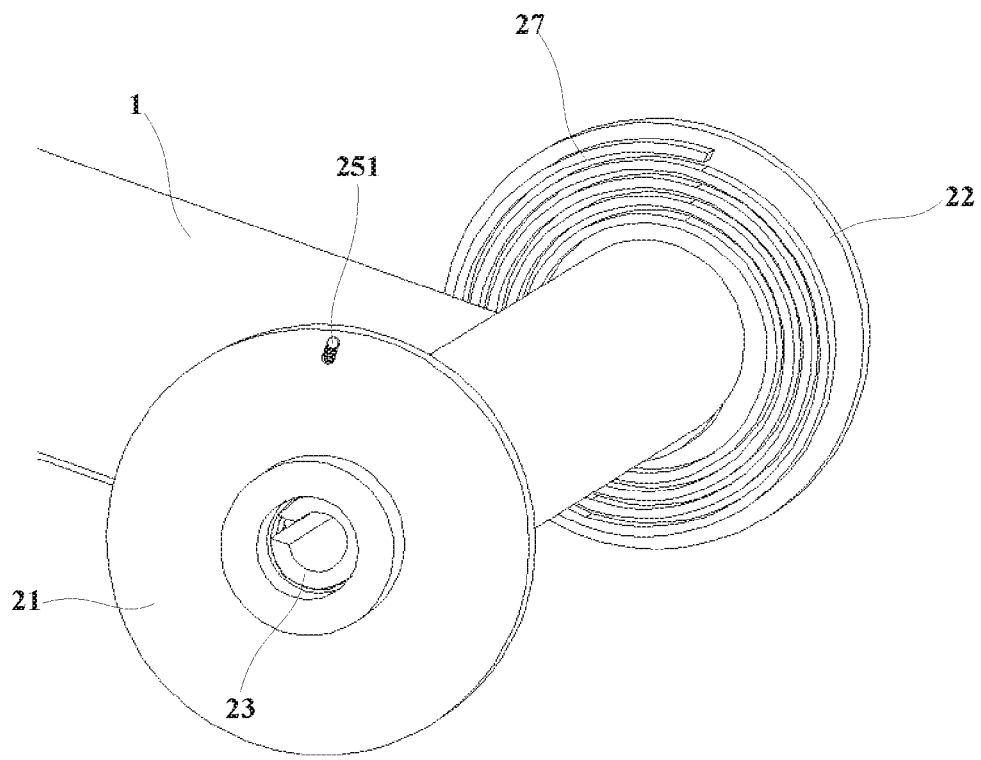
FIG. 3 shows a reset spring in an embodiment of the present disclosure.
Figure 4:
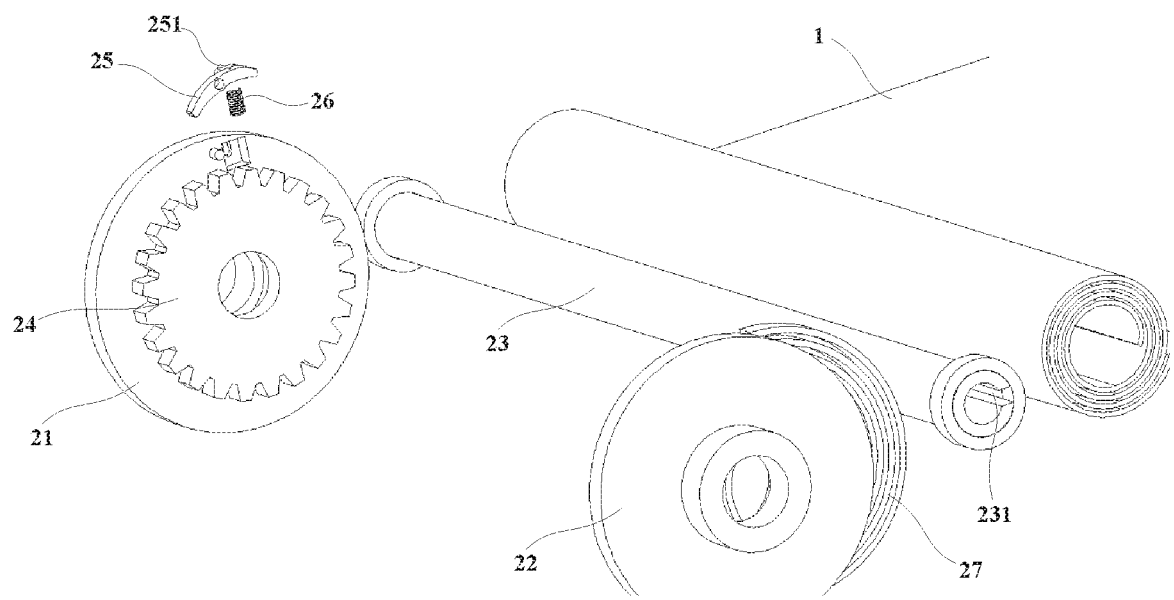
FIG. 4 is an exploded view of a receptacle mechanism and a flexible display screen in an embodiment of the present disclosure.
Figure 5:
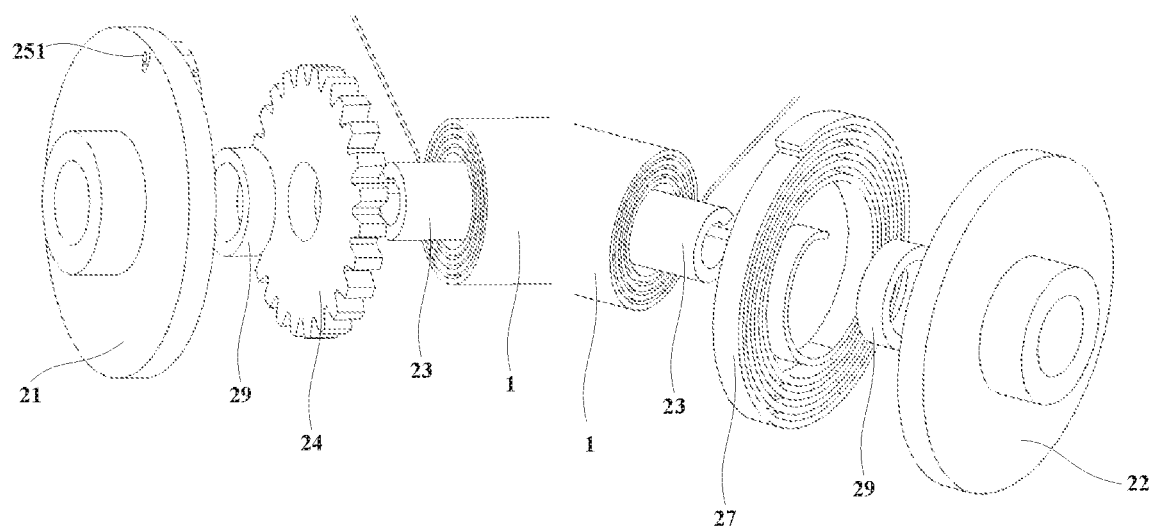
FIG. 5 shows assembling of a spool with a first end cap and a second end cap in an embodiment of the present disclosure.

As shown in FIGS. 3 and 5, the first end cap 21 has a chute through hole, and the pawl 25 has a post 251 that passes through the chute through hole and extends to the outside of the first end cap 21. By moving the post 251 in the chute through hole, the pretension force of the pretension spring 26 can be overcome to separate the pawl 25 from the ratchet 24.

Figure 2:
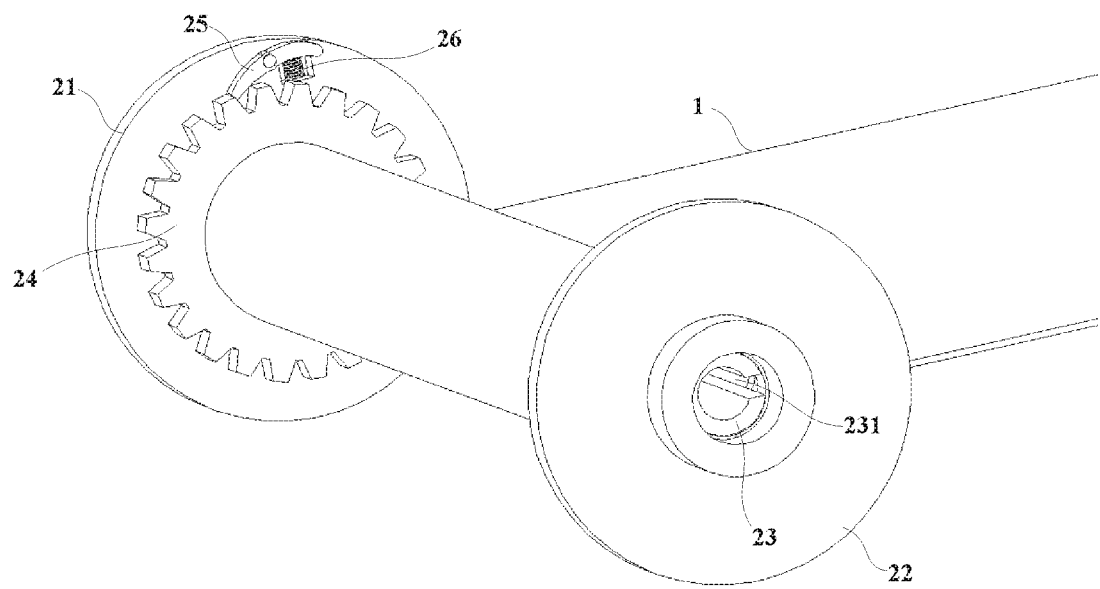
FIG. 2 shows a ratchet mechanism in an embodiment of the present disclosure.

In the above embodiment of the present disclosure, the specific type of the pretension spring 26 is unlimited, which may be, for example, a compression spring as shown in FIG. 2, or a torsion spring and the like. The reset spring 27 may be embodied as a flat spiral spring, also known as a clockwork spring.

As illustrated in FIG. 1, the receptacle mechanism 2 further includes a housing 28 that is coaxially sheathed onto the outside of the spool 23, and an inner surface of the housing 28 is spaced apart from an outer surface of the spool 23 to form a receptacle space to accommodate the portion of the flexible display screen that is reeled on the spool 23 in the receptacle space so that the housing 28 can protect the flexible display screen reeled therein effectively from accidental damage or scratches. The housing 28 may have a flexible display screen outlet 281, and the second lateral edge of the flexible display screen 1 may be provided with a stopper 121 capable of cooperating with the flexible display screen outlet 281. When the flexible display screen 1 is completely reeled in the receptacle mechanism 2, the stopper 121 is located outside of the flexible display screen outlet 281, and facilitates the operation of stretching the flexible display screen 1. In addition, the ratchet 24 and the spool 23 may be in a keyed connection. A bearing 29 may be disposed between the spool 23, the first end cap 21, and the second end cap 22 to increase stability and reliability of the rotation.

As illustrated in FIG. 2, the spool 23 is a hollow spool with a through slot 231. The internal space of the hollow spool can be used to accommodate components such as a circuit board, thereby effectively utilizing the space, making the flexible display device and the mobile terminal including the same smaller and more portable.

Figure 6A:
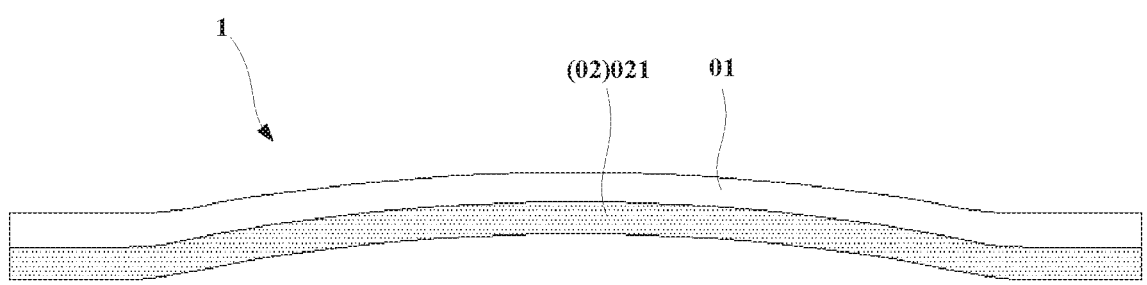
FIG. 6A is a cross-sectional view of the flexible display screen along A-A direction of FIG. 1 in an embodiment of the present disclosure.

As shown in FIG. 6A, in an embodiment of the present disclosure, the flexible display screen 1 includes a flexible display screen body 01 and an elastic support structure 02 on the back side of the flexible display screen body 01. The elastic support structure 02 includes an elastic support layer 021 that bulges toward the flexible display screen body 01 and extends in the stretching direction of the flexible display screen 1. When the stretched-out portion of the flexible display screen 1 is displaying, an internal stress of the elastic supporting layer 021 supports the flexible display body 01 to prevent it from collapsing and to keep it in a flat state, thereby producing a better display effect. The specific material of the elastic support layer 021 is unlimited, which may be, for example, a bendable rigid metal foil with certain elasticity.

In the embodiment shown in FIG. 6A, the elastic support structure 02 only includes the elastic support layer 021 which may be bonded and fixed to the flexible display screen body 01.

Figure 6B:
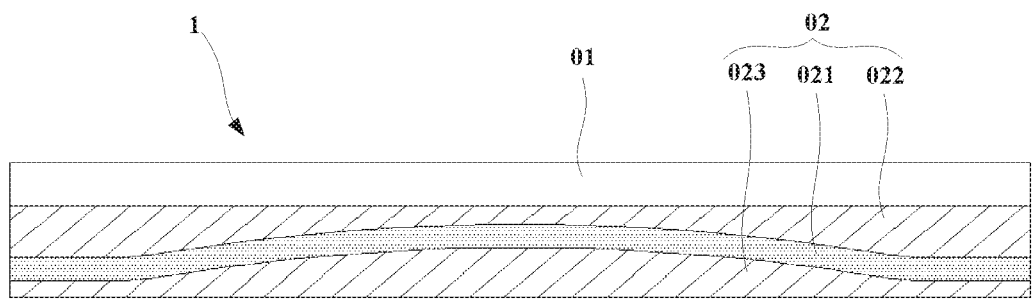
FIG. 6B is a cross-sectional view of the flexible display screen along A-A direction of FIG. 1 in another embodiment of the present disclosure.

As shown in FIG. 6B, in another embodiment of the present disclosure, apart from the elastic support layer 021, the elastic support structure 02 further includes a first buffer flat layer 022 on a side of the elastic support layer 021 adjacent to the flexible display screen body 01, and a second buffer flat layer 023 on a side of the elastic support layer 021 away from the flexible display screen body 01. With this design, when the stretched-out portion of the flexible display screen 1 is displaying, the front and rear surfaces thereof are flat to create better display effect, and the front and rear surfaces of the reeled portion of the flexible display screen 1 present smooth curved surfaces. The first buffer flat layer 022 and the second buffer flat layer 023 can buffer and protect the flexible display body 01, thereby effectively preventing scratch and damage.

Figure 6C:
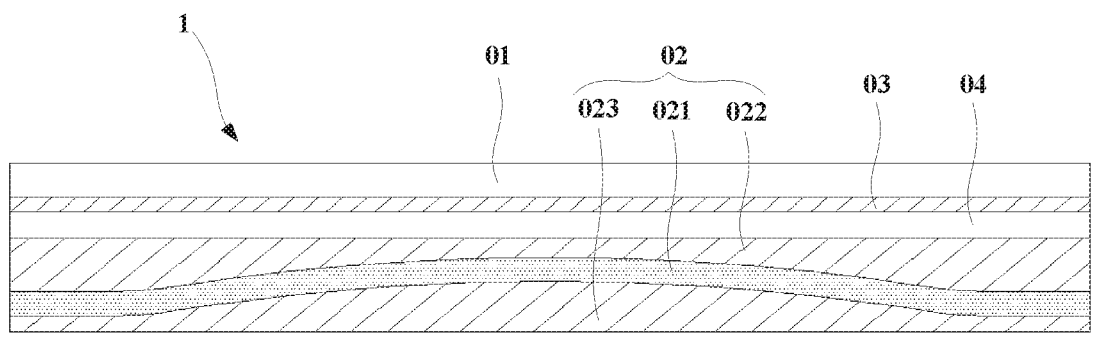
FIG. 6C is a cross-sectional view of the flexible display screen along A-A direction of FIG. 1 in still another embodiment of the present disclosure.

As shown in FIG. 6C, in another embodiment of the present disclosure, the flexible display screen 1 further includes a buffer layer 03 and a circuit layer 04. The buffer layer 03, the circuit layer 04, and the elastic support structure 02 are sequentially disposed on the back side of the flexible display screen body 01. With this design, some circuits of the flexible display device or the mobile terminal can be designed in the circuit layer 04 of the flexible display screen 1 and reeled with the flexible display screen 1, thereby allowing the flexible display device or the mobile terminal to have a smaller volume. The first buffer flat layer 022, the second buffer flat layer 023, and the buffer layer 03 may be made of buffer glue.

Figure 7A:
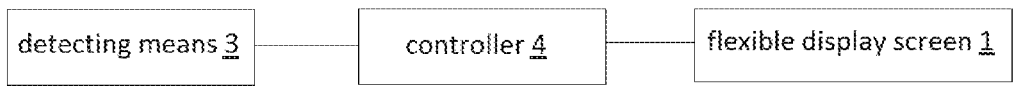
FIG. 7A shows the circuit configuration of a flexible display device in an embodiment of the present disclosure.

As shown in FIG. 7A, in an embodiment of the present disclosure, the flexible display device includes detecting means 3 for detecting rotation information of the spool or the ratchet, and a controller 4 electrically connected to the detecting means 3 and to the flexible display screen 1. The controller 4 is configured to determine the stretched-out size information of the flexible display screen according to the rotation information of the spool or the ratchet, control the stretched-out portion of the flexible display screen to display according to the stretched-out size information of the flexible display screen, and control the reeled portion of the flexible display screen 1 in an inactive state. With this design, only the stretched-out portion of the flexible display screen 1 is in an active state, while the reeled portion is in an inactive state, thereby effectively reducing power consumption of the flexible display device.

Figure 7B:
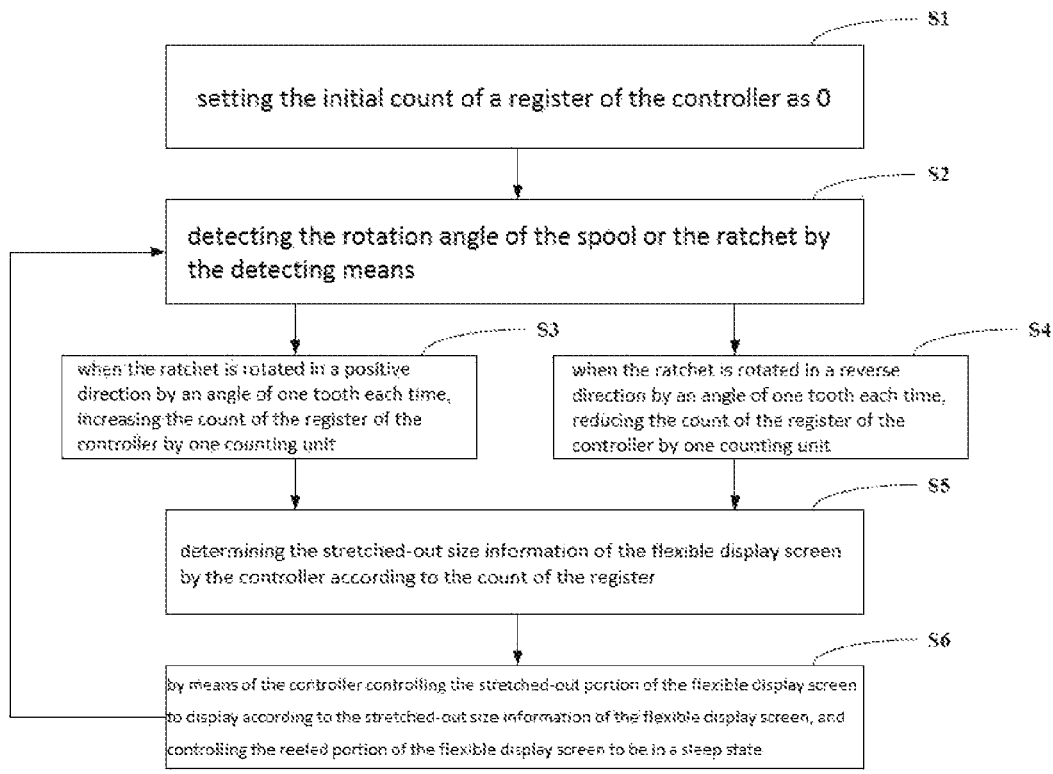
FIG. 7B is a display control flowchart of a flexible display device in an embodiment of the present disclosure.

In the above embodiment, according to the structural characteristics of the ratchet mechanism, the stretched-out size of the flexible display screen 1 is changed discretely, and during the process of stretching the flexible display screen 1 from the completely reeled state to the maximum size, each angle at which the spool 23 or the ratchet 24 rotates by one tooth (the spool 23 and the ratchet 24 have the same rotation angle because of fixed connection therebetween) corresponds to an individual stretched-out size of the flexible display screen 1. The display control principle of the flexible display screen 1 is illustrated as in FIG. 7B, including the following steps:

Step S1: setting the initial count of a register of the controller as 0 (zero), at this point, the controller controls the flexible display screen to be in an inactive state entirely as the flexible display screen is fully reeled;

Step S2: detecting the rotation angle of the spool or the ratchet by the detecting means;

Step S3: when the ratchet is rotated in a positive direction by an angle of one tooth each time, increasing the count of the register of the controller by one counting unit, thereby gradually stretching the flexible display screen;

Step S4: when the ratchet is rotated in a reverse direction by an angle of one tooth each time, reducing the count of the register of the controller by one counting unit, thereby gradually reeling the flexible display screen;

Step S5: determining the stretched-out size information of the flexible display screen by the controller determines according to the count of the register; and Step S6: by means of the controller controlling the stretched-out portion of the flexible display screen to display according to the stretched-out size information of the flexible display screen, and controlling the reeled portion of the flexible display screen to be in an inactive state.

As shown in FIG. 9A, the embodiment of the present disclosure further provides a mobile terminal including a mobile terminal body 5 and the flexible display device 100 according to any of the foregoing technical solutions connected to the mobile terminal body 5. The mobile terminal is portable after the screen is reeled, and in addition, presents more diversified screen sizes.

When the spool of the flexible display device is a hollow spool and has a through slot, at least one functional module and/or at least one circuit board of the mobile terminal is located inside the hollow spool. In this solution, the internal space of the hollow spool is effectively utilized, which makes the mobile terminal more compact and portable when being retracted.

Figure 9B:
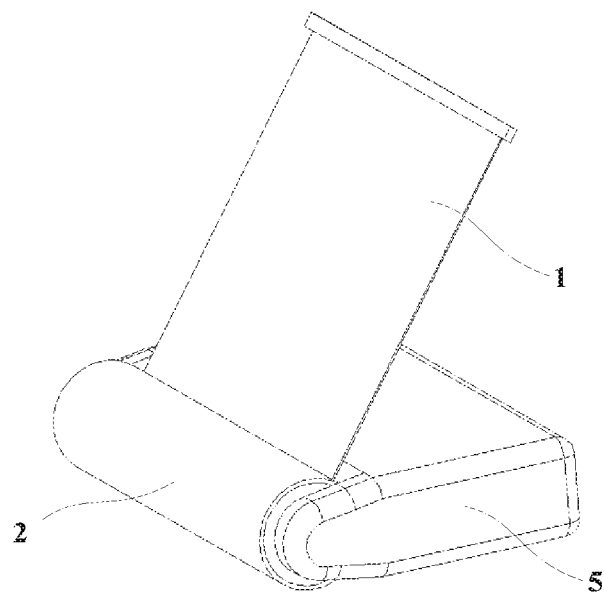
FIG. 9B shows a use state of a mobile terminal in an embodiment of the present disclosure.
Figure 9C:
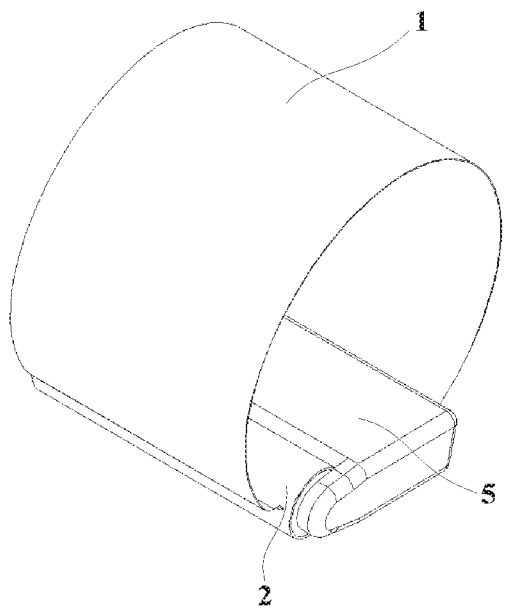
FIG. 9C shows another use state of a mobile terminal in an embodiment of the present disclosure.

As shown in FIGS. 1, 9B, and 9C, in an embodiment of the present disclosure, the first end cap 21 and the second end cap 22 are fixedly connected to the housing 28, and are also connected to the mobile terminal body in a rotatable manner with respect thereto by means of the first damping connector 61 and the second damping connector (not shown), respectively. With this design, the stretched-out portion of the flexible display screen 1 can be maintained at any angle with respect to the mobile terminal body 5, thereby facilitating adjustment by a user and enhancing the viewing effect.

As shown in FIG. 9C, in this embodiment, the flexible display screen 1 is bent into a ring shape, wearable on the wrist of a user, and adjustable according to the size of the user's wrist, which is aesthetic and practical.

Figure 8:
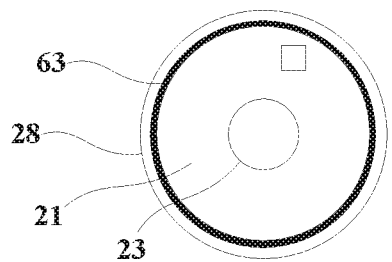
FIG. 8 shows the connection between a housing and first and second end caps in an embodiment of the present disclosure.

As shown in FIG. 8, in another embodiment of the present disclosure, the first end cap 21 and the second end cap (not shown) are fixedly connected to the mobile terminal body (not shown), and also are connected to the housing 28 in a rotatable manner with respect thereto by a third damping connector 63 and a fourth damping connector (not shown), respectively. With this design, the stretched-out portion of the flexible display screen can also be maintained at any angle with respect to the mobile terminal body, thereby facilitating adjustment by a user and enhancing the viewing effect.

In one embodiment, when the spool of the flexible display device is a hollow spool and has a through slot, at least one functional module of the mobile terminal, such as a vibrator, a gyroscope, a power source, etc., and/or at least one circuit board is located inside the hollow spool, thereby making effective use of the space, and enabling the mobile terminal more compact and portable.

Figure 10A:
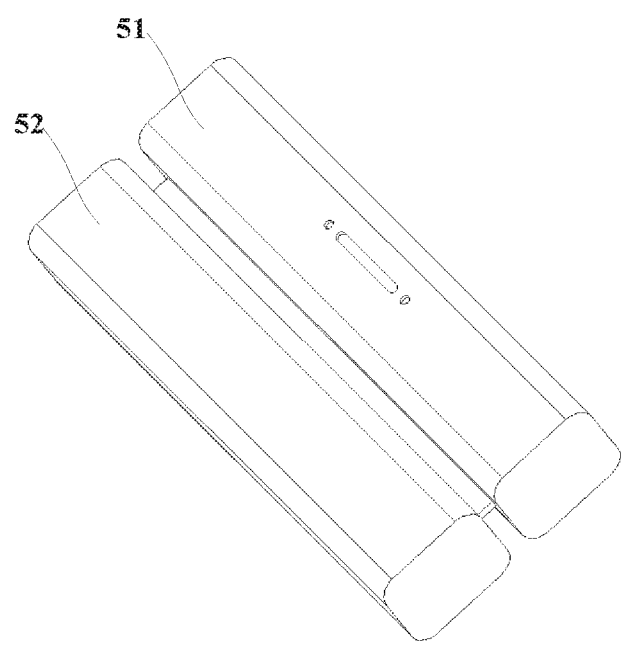
FIG. 10A shows a retracted state of a mobile terminal in an embodiment of the present disclosure.
Figure 10B:
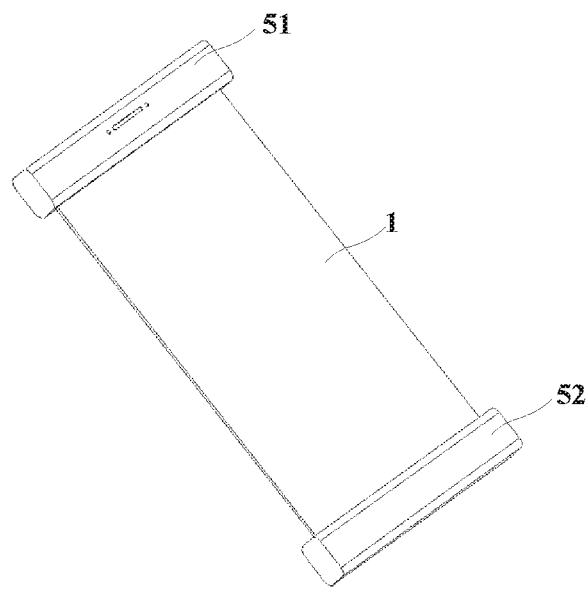
FIG. 10B shows a use state of a mobile terminal in an embodiment of the present disclosure.
Figure 10C:
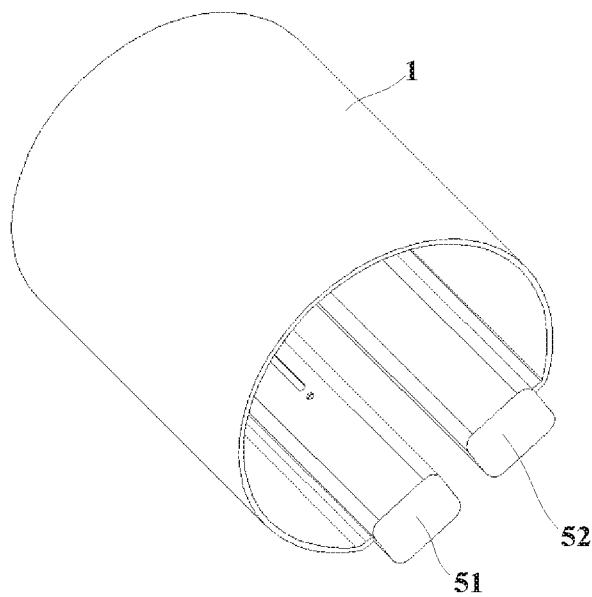
FIG. 10C shows another use state of a mobile terminal in an embodiment of the disclosure.

In the foregoing embodiment, the mobile terminal body 5 is disposed at one side of the flexible display device 100. However, the structure of the mobile terminal body 5 is not limited to this. As shown in FIGS. 10A, 10B, and 10C, in this embodiment, the mobile terminal body includes a first portion 51 into which the receptacle mechanism is integrated and a second portion 52 to which the second lateral edge of the flexible display 1 is connected. The flexible display screen 1 can be stretched-out by pulling the second portion 52 of the mobile terminal body 5.

It will be apparent that those skilled in the art can make various modifications and variations to the present disclosure without departing from the spirit and scope of the disclosure. Thus, the present disclosure is intended to encompass such modifications and variations as the modifications and variations of the present disclosure are within the scope of the claims and the equivalents thereof.

What is claimed is:

1. A flexible display device comprising a receptacle mechanism and a flexible display screen, wherein the receptacle mechanism comprises a first end cap and a second end cap opposed to each other, a spool pivotally mounted on the first end cap and the second end cap, a ratchet fixedly connected to the spool, a pawl hinged to the first end cap, a pretension spring abutting the first end cap and the pawl respectively, and a reset spring fixedly connected to the spool and the second end cap respectively, wherein the flexible display screen comprises a first lateral edge and a second lateral edge opposed to each other, the first lateral edge fixedly connected to the spool, wherein when a first external force in a direction away from the spool is applied to the second lateral edge of the flexible display screen, the spool and the ratchet are rotated in a positive direction, and the reset spring accumulates energy, such that the flexible display screen is stretched-out, wherein when the first external force is cancelled, the pawl is inserted between teeth of the ratchet under a pretension force of the pretension spring to lock a reverse rotation of the spool and the ratchet, and thus to lock a stretched-out size of the flexible display screen, and wherein when a second external force against the pretension force of the pretension spring is applied to the pawl, the pawl is separated from the ratchet, the spool and the ratchet are rotated reversely by a resetting force of the reset spring, and the flexible display screen is reeled on the spool.

2. The flexible display device according to claim 1, wherein the receptacle mechanism further comprises a housing spaced from and sheathed onto the spool, wherein the housing has a flexible display screen outlet, and wherein the second lateral edge of the flexible display screen is provided with a stopper that can be cooperative with the flexible display screen outlet.

3. The flexible display device according to claim 1, wherein the first end cap has a chute through-hole, and wherein the pawl has a post that passes through the chute through-hole and extends to an outside of the first end cap.

4. The flexible display device according to claim 1, wherein the spool is a hollow spool with a through slot such that at least one of at least one functional module and at least one circuit board can be disposed inside the hollow spool.

5. The flexible display device according to claim 1, wherein the flexible display screen comprises a flexible display screen body and an elastic support structure on a back side of the flexible display body, and wherein the elastic support structure comprises an elastic support layer that bulges towards the flexible display screen body and extends in a stretching direction of the flexible display screen.

6. The flexible display device according to claim 5, wherein the elastic support structure further comprises a first buffer flat layer on a side of the elastic support layer adjacent to the flexible display screen body, and a second buffer flat layer on a side of the elastic support layer away from the flexible display screen body.

7. The flexible display device according to claim 5, wherein the flexible display screen further comprises a buffer layer and a circuit layer, and wherein the buffer layer, the circuit layer, and the elastic support structure are sequentially disposed on the back side of the flexible display screen body.

8. The flexible display device according to claim 1, further comprising detecting means for detecting rotation information of the spool or the ratchet, and a controller electrically connected to the detecting means and to the flexible display screen, the controller configured to determine stretched-out size information of the flexible display screen according to the rotation information of the spool or the ratchet, control the stretched-out portion of the flexible display screen to display according to the stretched-out size information of the flexible display screen, and control the reeled portion of the flexible display screen to be in an inactive state.

9. A mobile terminal comprising a mobile terminal body and a flexible display device according to claim 1 connected to the mobile terminal body.

10. The mobile terminal according to claim 9, wherein the receptacle mechanism further comprises a housing sheathed onto and spaced from the spool, wherein the housing has a flexible display screen outlet, wherein the first end cap and the second end cap are fixedly connected to the housing, and wherein the first end cap and the second end cap are connected to the mobile terminal body in a rotatable manner with respect thereto by a first damping connector and a second damping connector respectively.

11. The mobile terminal according to claim 9, wherein the receptacle mechanism further comprises a housing sheathed onto and spaced from the spool, wherein the housing has a flexible display screen outlet, wherein the first end cap and the second end cap are fixedly connected to the mobile terminal body, and wherein the first end cap and the second end cap are connected to the housing in a rotatable manner with respect thereto by a third damping connector and a fourth damping connector respectively.

12. The mobile terminal according to claim 9, wherein the mobile terminal body comprises a first portion into which the receptacle mechanism is integrated and a second portion to which the second lateral edge of the flexible display screen is connected.

* * * * *